United States Patent
Smith et al.

(10) Patent No.: US 7,101,788 B2
(45) Date of Patent: Sep. 5, 2006

(54) SEMICONDUCTOR DEVICES AND METHODS OF MANUFACTURING SUCH SEMICONDUCTOR DEVICES

(75) Inventors: Patricia Beauregard Smith, Colleyville, TX (US); Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/342,013

(22) Filed: Jan. 14, 2003

(65) Prior Publication Data

US 2003/0162384 A1    Aug. 28, 2003

Related U.S. Application Data

(60) Provisional application No. 60/359,991, filed on Feb. 28, 2002.

(51) Int. Cl.
*H01L 21/4763* (2006.01)
(52) U.S. Cl. .................. 438/637; 438/672; 438/687
(58) Field of Classification Search ........ 438/629–631, 438/633–634, 637, 672, 687
See application file for complete search history.

(56) References Cited

U.S. PATENT DOCUMENTS

| | | | | |
|---|---|---|---|---|
| 5,883,014 A * | 3/1999 | Chen et al. | ................ | 438/782 |
| 6,028,015 A * | 2/2000 | Wang et al. | ................ | 438/789 |
| 6,114,259 A * | 9/2000 | Sukharev et al. | ........... | 438/789 |
| 6,281,135 B1 * | 8/2001 | Han et al. | .................... | 438/725 |
| 6,368,979 B1 * | 4/2002 | Wang et al. | ................ | 438/723 |
| 6,583,046 B1 * | 6/2003 | Okada et al. | ............... | 438/622 |
| 6,589,887 B1 * | 7/2003 | Dalton et al. | ............... | 438/765 |
| 6,630,740 B1 * | 10/2003 | Orita et al. | ................. | 257/762 |
| 6,656,832 B1 * | 12/2003 | Pan et al. | ................... | 438/627 |
| 6,667,553 B1 * | 12/2003 | Cerny et al. | ................ | 257/758 |
| 2001/0016419 A1 * | 8/2001 | Huang | ........................ | 438/687 |
| 2003/0087522 A1 * | 5/2003 | Ngo et al. | .................. | 438/660 |

* cited by examiner

*Primary Examiner*—Hsien-Ming Lee
(74) *Attorney, Agent, or Firm*—W. James Brady, III; Frederick J. Telecky, Jr.

(57) ABSTRACT

A method of manufacturing a semiconductor device includes the steps of providing a semiconductor substrate (102), forming a dielectric layer (104) over the semiconductor substrate (102), and etching a trench structure (106) or a via structure (106) in the dielectric layer (104) to expose a portion of a surface of the semiconductor substrate (102). The method also includes the steps of treating a surface (104a) of the dielectric layer (104) with an adhesion solution, such as a reactive plasma including hydrogen, and forming a diffusion barrier layer (110) over the dielectric layer (104). Moreover, the adhesion solution chemically interacts with the surface (104a) of the dielectric layer (104) and enhances or increases adhesion between dielectric layer (104) and diffusion barrier layer (110).

14 Claims, 2 Drawing Sheets

SEMICONDUCTOR DEVICES AND METHODS OF MANUFACTURING SUCH SEMICONDUCTOR DEVICES

This application claims priority under 35 USC § 119 (e)(1) of provisional application No. 60/359,991 filed Feb. 28, 2002.

BACKGROUND OF THE INVENTION

1. Field of the Invention

The present invention relates generally to the field of semiconductor devices. Specifically, the invention relates to semiconductor devices having a dielectric layer and a diffusion barrier layer formed over the dielectric layer, and methods of manufacturing such semiconductor devices.

2. Description of Related Art

A known method of manufacturing a known semiconductor device having copper interconnect lines includes the step of forming a dielectric layer over a semiconductor substrate. The semiconductor substrate may include device layers which previously were manufactured on the substrate. The method also includes the step of etching a plurality of via structures or a plurality of trench structures into the dielectric layer. Because copper atoms diffuse readily into other materials, such known methods also include the step of forming a diffusion barrier layer, e.g., a metal diffusion barrier layer, over the dielectric layer. Known metal diffusion barrier layers may comprise Ta, Ti, TaN, TiN, $W_2N$, or similar metal compounds which, when used in a layer of sufficient thickness, substantially reduces or prevents the diffusion of copper atoms from one material to another material. This method also includes the steps of forming a copper seed layer over the diffusion barrier layer, and forming an electroplated or otherwise deposited copper layer over the copper seed layer. Moreover, a portion of the copper seed layer, a portion of the copper plate layer, and a portion of the diffusion barrier layer subsequently are removed by a known, chemical-mechanical polishing process, and a stop etch layer may be formed over the exposed copper plate layer.

As a trend for developing semiconductor devices capable of operating at faster speeds continues, the interconnect lines, e.g., copper interconnect lines, have become a speed bottleneck for developing semiconductor devices capable of operating at faster speeds. When the dielectric constant of the dielectric layer employed in the semiconductor device decreases, the speed at which the semiconductor may operate may increase. Consequently, there has been an increased demand for a dielectric layer having a lower dielectric constant, e.g., about 4.0 or less. For example, in another known method of manufacturing a known semiconductor device, the dielectric layer, e.g., a silicon oxide dielectric layer, may be modified with organic ligands, e.g., organosilicate glass, polymeric dielectric films, or the like, which may decrease the dielectric constant of the dielectric layer. However, adhesion between the modified dielectric layer and the metal diffusion barrier layer inherently may be weak. In yet another known method of manufacturing a known semiconductor device, a reactive metal, e.g., Ti or Cr, may be deposited on the modified dielectric layer by physical vapor deposition prior to forming the metal diffusion barrier layer over the modified dielectric layer. The reactive metal deposited on the modified dielectric layer may increase adhesion between the modified dielectric layer and the metal diffusion barrier layer. Nevertheless, for most semiconductor devices having copper interconnect lines and a dielectric layer with a low dielectric constant, e.g., about 4.0 or less, the depth of the trench structure or the via structure formed in the dielectric layer is greater than the width of the trench structure or the via structure, respectively. As such, when physical vapor deposition methods are used to deposit the reactive metal on the modified dielectric layer, it may be difficult to form a reactive barrier layer on the modified dielectric layer having a substantially level topography, e.g., the reactive barrier layer has a decreased step coverage. Consequently, the performance of the semiconductor device is degraded using these known methods of manufacturing such known semiconductor devices.

SUMMARY OF THE INVENTION

Therefore, a need has arisen for semiconductor devices and methods of manufacturing such semiconductor devices that overcome these and other shortcomings of the related art. A technical advantage of the present invention is that a surface of the dielectric layer may be treated with an adhesion promotion solution, e.g., a reactive plasma comprising hydrogen. Treating the dielectric layer with the adhesion solution may enhance or increase adhesion between the dielectric layer and a diffusion barrier layer formed over or on top of the dielectric layer. For example, the adhesion solution may be applied using the same apparatus that is used to remove a dielectric trench structure pattern, e.g., a photoresist layer, using the same apparatus that is used to etch the dielectric layer, or using the same apparatus that is used to form the diffusion barrier layer. Moreover, the adhesion solution may chemically interact with a portion of the dielectric layer, which may increase the reactivity of the surface of the dielectric layer. Increasing the reactivity of the surface of the dielectric layer may enhance an ability of the surface of the dielectric layer to adhere or bond to other layers, e.g., a metal or a dielectric diffusion barrier layer.

In an embodiment of the present invention, a method of manufacturing a semiconductor device is described. The method comprises the steps of providing a semiconductor substrate, forming a dielectric layer over at least a portion of the semiconductor substrate, and etching at least one trench structure or at least one via structure in the dielectric layer to expose a portion of a surface of the semiconductor substrate. The method also comprises the steps of treating at least a portion of a surface of the dielectric layer with an adhesion solution comprising hydrogen, and forming a diffusion barrier layer over at least a portion of the dielectric layer. Moreover, the adhesion solution chemically interacts with the surface of the dielectric layer, such that an ability of the dielectric layer to adhere to other layers, e.g., the diffusion barrier layer, increases.

In yet another embodiment of the present invention, a semiconductor device is described. The semiconductor device comprises a semiconductor substrate and a dielectric layer formed over at least a portion of the semiconductor substrate. Moreover, at least a portion of a surface of the dielectric layer comprises hydrogen. The semiconductor device also comprises a diffusion barrier layer formed over at least a portion of the dielectric layer.

Other features and advantages will be apparent to persons of ordinary skill in the art in view of the following detailed description of the invention and the accompanying drawings.

BRIEF DESCRIPTION OF THE DRAWINGS

For a more complete understanding of the present invention, needs satisfied thereby, and the features and advantages thereof, reference now is made to the following descriptions taken in connection with the accompanying drawings.

DETAILED DESCRIPTION OF PREFERRED EMBODIMENTS

Figure 1A:
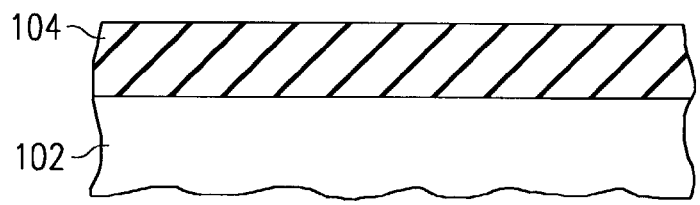
FIGS. 1a–1e are cross-sectional schematics depicting a semiconductor device, and a method of manufacturing the semiconductor device, according to an embodiment of the present invention.
Figure 1B:
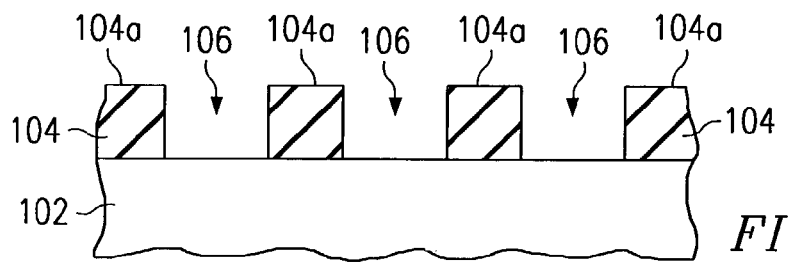
Figure 1C:
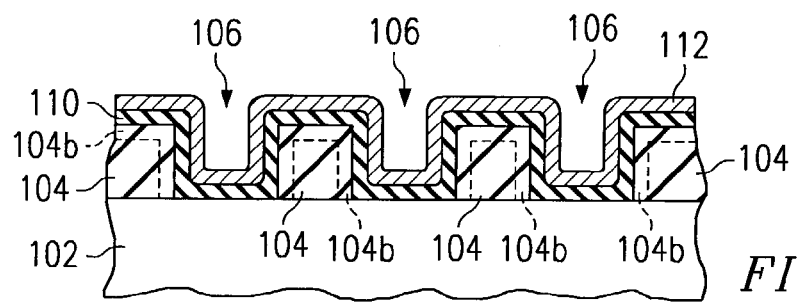
Figure 1D:
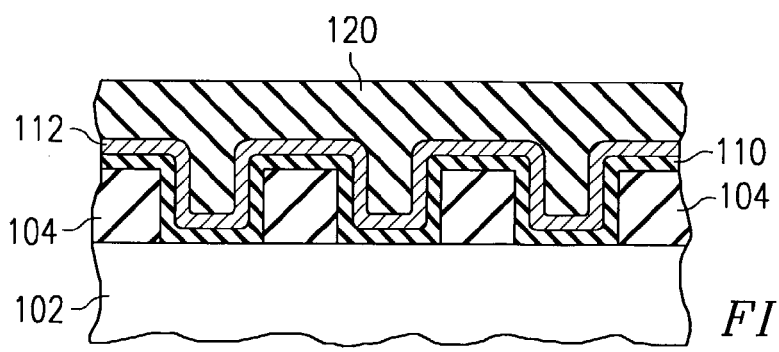
Figure 1E:
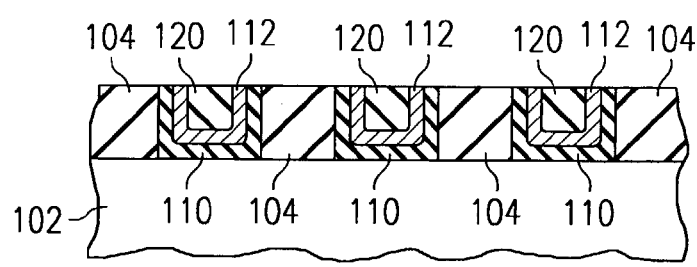

Preferred embodiments of the present invention and their advantages may be understood by referring to FIGS. 1a–1e, and 2a–2b, like numerals being used for like corresponding parts in the various drawings.

Referring to FIGS. 1a–1e, and 2a, a method of manufacturing a semiconductor device according embodiments of the present invention are described. In step 202, a semiconductor substrate 102 is provided, and in step 204, a dielectric layer 104 may be formed over at least a portion of semiconductor substrate 102. Dielectric layer 104 may comprise any known dielectric material having a low dielectric constant, e.g., about 4.0 or less. For example, dielectric layer 104 may comprise $SiO_{(x)}R_{(y)}$, in which (x) is greater than one, (y) is greater than zero, and the letter symbol R refers to any organic group compound comprising hydrogen and carbon. Moreover, it will be understood by those of ordinary skill in the art that such organic groups include amino groups, hydroxyl groups, vinyl groups, methyl groups, and the like. In one embodiment, dielectric layer 104 may be formed over semiconductor substrate 102 along the entire surface of semiconductor substrate 102. In step 206, at least one via structure or at least one trench structure 106 may be etched in dielectric layer 104, such that dielectric layer 104 no longer may be formed over the entire surface of semiconductor substrate 102 and portions of the surface of semiconductor substrate 102 are exposed. Electrical contact between semiconductor substrate 102 and an interconnect metal, e.g., copper, is accomplished through via structures or trench structures 106, which are filled with the interconnect metal. For example, trench structure or via structure 106 may be etched in dielectric layer 104 using a dielectric trench structure pattern (not shown) comprising a photosensitive material, such as photoresist, or the like. Moreover, trench structures or via structures 106 may be etched in areas where interconnect lines or structures, e.g., copper interconnect lines or structures, may be disposed.

In each of the forgoing embodiments, in step 208, at least a portion of a surface 104a of dielectric layer 104 is treated with an adhesion promotion solution comprising hydrogen. In one embodiment, the adhesion promotion solution may be 100% hydrogen. In another embodiment, the adhesion solution may comprise hydrogen and further may comprise argon, neon, helium, nitrogen, or the like, or combinations thereof. When surface 104a is treated with the adhesion solution, the adhesion solution chemically interacts with surface 104a, such that at least a portion of surface 104a comprises hydrogen. Moreover, the adhesion solution may diffuse into a portion of dielectric layer 104, such that a near surface portion 104b of dielectric layer 104 also may comprise hydrogen. While not wishing to be bound by a theory, it is believed that treating surface 104a of dielectric layer 104 with the adhesion solution may partially or entirely strip surface 104a or near surface portion 104b, or both, of the organic group represented by the letter R, such that the organic group is replaced by hydrogen or a dangling bond is formed. When the organic group is replaced by hydrogen or when dangling bonds are present, or both, the reactivity of surface 104a may increase. Increasing the reactivity of surface 104a may enhance an ability of surface 104a to bond or adhere to other layers, i.e., a metal diffusion barrier layer or a dielectric diffusion barrier layer.

In each of the forgoing embodiments, in step 210, a diffusion barrier layer 110 may be formed over at least a portion of semiconductor body 102 and over at least a portion of dielectric layer 104. As such, at least a portion of diffusion barrier layer 110 may be formed within trench structures or via structures 106 and at least a portion of diffusion barrier layer 110 may be formed outside trench structures or via structures 106. In a preferred embodiment, the same apparatus that is used to form diffusion barrier layer 110 may be used to apply the adhesion solution. Using the same apparatus that is used to form diffusion barrier layer 110 to apply the adhesion solution may improve adhesion between dielectric layer 104 and barrier diffusion layer 110 while reducing the opportunity for the adhesion solution to undesirably react with species, e.g., air contaminants, other than diffusion barrier layer 110. Moreover, in one embodiment, diffusion barrier layer 110 may comprise a metal diffusion barrier layer 110. For example, metal diffusion barrier layer 110 may comprise Ta, TaN, $Ta_2N$, Ti, TiN, $W_2N$, or any other elements or compounds suitable for use with conductive materials, such as copper, which substantially reduces or prevents the diffusion of atoms from one material to another material, or combinations thereof. In another embodiment, diffusion barrier layer 110 may comprise a dielectric diffusion barrier layer 110. For example, dielectric diffusion barrier layer 110 may comprise $SiO_2$, $SiN_x$, SiC, $SiCN_x$, $SiOC_x$, or any other elements or compounds suitable for use with conductive materials, such as copper, which substantially reduces or prevents the diffusion of atoms from one material to another material, or combinations thereof. In an embodiment, diffusion barrier layer 110 may be formed over at least a portion of dielectric layer 104 substantially immediately after surface 104a of dielectric layer 104 is treated with the adhesion solution. Forming diffusion barrier layer 110 substantially immediately after treating surface 104a with the adhesion solution may substantially reduce or prevent an undesired reaction, e.g., hydrocarbon or water vapor contamination, or both, which may occur when surface 104a is exposed to air. Specifically, when surface 104a is treated with the adhesion solution and subsequently is exposed to air for a predetermined period of time, surface 104a may become passivated, and the passivated surface 104a may be chemically unreactive, i.e., may not enhance or increase adhesion between dielectric layer 104 and other layers, such as diffusion barrier layer 110. Moreover, when surface 104a is treated with the adhesion solution and subsequently is exposed to air for the predetermined period of time, surface 104a may become hydrated and also may become contaminated, which degrades the performance of the semiconductor device.

In each of the foregoing embodiments, in step 212, at least one conductive layer, e.g., a seed layer 112 or a plate layer 120, or both, may be formed over diffusion barrier layer 110.

Figure 2A:
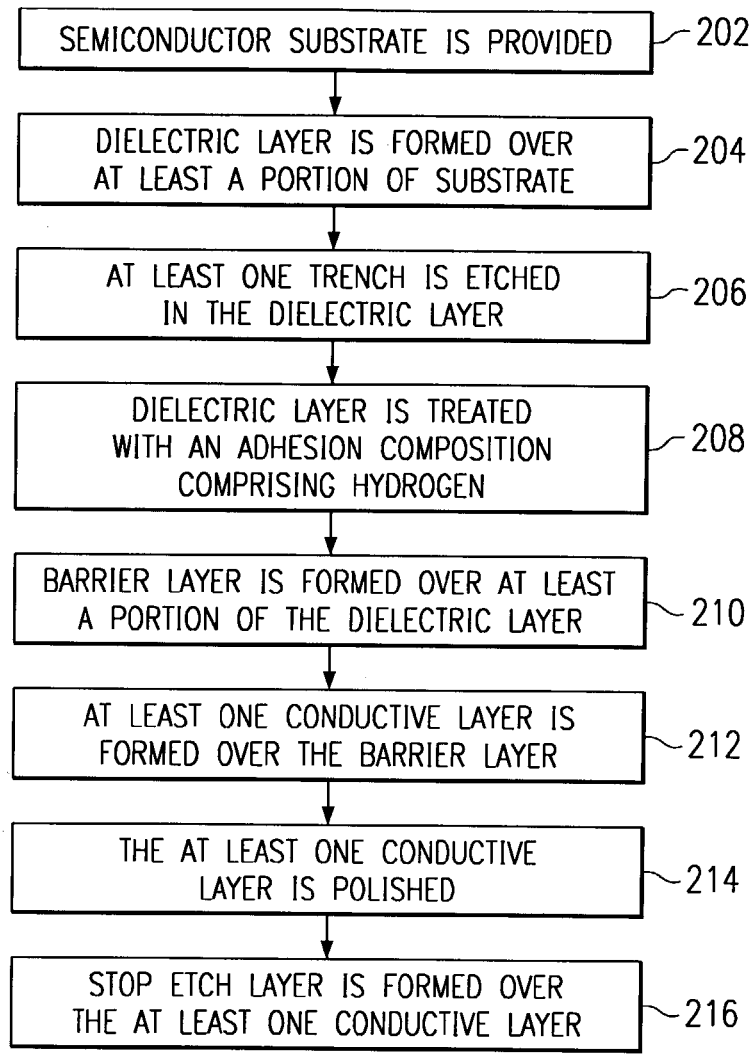
FIG. 2a is a flow chart of a method of manufacturing the semiconductor device of FIGS. 1a–1e, according to an embodiment of the present invention.
Figure 2B:
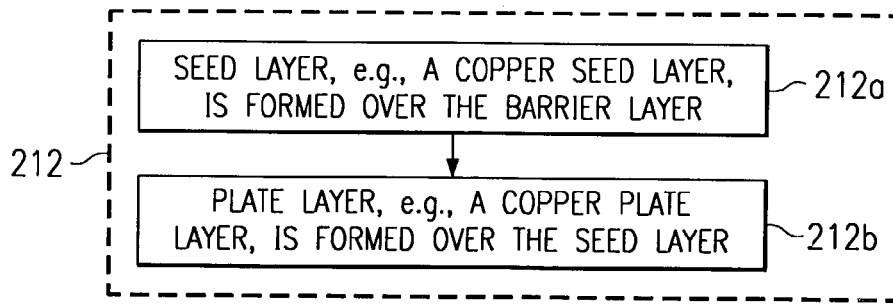
FIG. 2b is a flow chart of a method of manufacturing the semiconductor device of FIGS. 1a–1e, according to another embodiment of the present invention.

As such, at least a portion of the at least one conductive layer may be formed within trench structures or via structures 106, and at least a portion of the at least one conductive layer may be formed outside trench structures or via structures 106. Moreover, in one embodiment, the at least one conductive layer may comprise copper. Referring to FIG. 2b, step 212 may comprise steps 212a and 212b. In this embodiment, in step 212a, a seed layer 112 comprising copper may be formed over diffusion barrier layer 110, such that at least a portion of seed layer 112 may be formed within trench structures or via structures 106, and at least a portion of seed layer 112 may be formed outside trench structures or via structures 106. In step 212b, a plate layer 120 comprising copper may be formed over seed layer 112, such that at least a portion of plate layer 120 may be formed within trench structures or via structures 106, and at least a portion of plate layer 120 may be formed outside trench structures or via structures 106. Plate layer 120 may be electroplated or otherwise deposited over seed layer 112.

In each of the foregoing embodiments, in step 214, plate layer 120 may be polished, e.g., by any known chemical-mechanical polishing process. When plate layer 120 is polished, those portions of plate layer 120 formed outside trench structures or via structures 106 may be removed. Similarly, when plate layer 120 is polished, those portions of seed layer 112 formed outside trench structures or via structures 106 also may be removed, such that at least a portion of seed layer 112, at least a portion of plate layer 120, and at least a portion of dielectric layer 104 are exposed. Moreover, in step 216, a etch stop layer (not shown) may be formed over plate layer 120, such that additional levels of interconnect lines, e.g., copper interconnect lines, may be formed.

Referring again to FIGS. 1a–1e, a semiconductor device according embodiments of the present invention are described. The semiconductor device may comprise a semiconductor substrate 102 and a dielectric layer 104 formed over at least a portion of semiconductor substrate 102. Dielectric layer 104 may comprise any known dielectric material having a low dielectric constant, e.g., about 4.0 or less. Moreover, at least a portion of a surface 104a of dielectric layer 104, or a near surface portion 104b of dielectric layer 104, or both, may comprise hydrogen.

The semiconductor device also may comprise a diffusion barrier layer 110 formed over at least a portion of dielectric layer 104. As such, at least a portion of diffusion barrier layer 110 may be formed within trench structures or via structures 106 and at least a portion of diffusion barrier layer 110 may be formed outside trench structures or via structures 106. In one embodiment, diffusion barrier layer 110 may comprise a metal diffusion barrier layer 110. In another embodiment, diffusion barrier layer 110 may comprise a dielectric diffusion barrier layer 110.

The semiconductor device further may comprise at least one conductive layer formed over diffusion barrier layer 110, and the at least one conductive layer may comprise copper. In one embodiment, the at least one conductive layer may comprise a seed layer 112, e.g., a copper seed layer, formed over diffusion layer 110, and a plate layer 120, e.g., a copper plate layer formed over seed layer 112. The semiconductor device also may comprise a etch stop layer (not shown) formed over at least a portion of plate layer 120, such that additional levels of interconnect lines, e.g., copper interconnect lines, may be found.

While the invention has been described in connection with preferred embodiments, it will be understood by those of ordinary skill in the art that other variations and modifications of the preferred embodiments described above may be made without departing from the scope of the invention. Other embodiments will be apparent to those of ordinary skill in the art from a consideration of the specification or practice of the invention disclosed herein.

What is claimed is:

1. A method of manufacturing a semiconductor device comprising the steps of:
   providing a semiconductor substrate;
   forming a dielectric layer over at least a portion of said semiconductor substrate;
   etching at least one trench structure or at least one via structure in said dielectric layer to expose a portion of a surface of said semiconductor substrate;
   treating at least a portion of a surface of said dielectric layer with an adhesion solution, wherein said adhesion solution comprises over 50% hydrogen plasma and said adhesion solution chemically interacts with said surface of said dielectric layer whereby said adhesion solution partially or entirely replaces at least one organic group of said surface of said dielectric layer with hydrogen wherein said dielectric layer comprises $SiO_{(x)}R_{(y)}$ in which (x) is greater than one, (y) is greater than zero, and the letter symbol R refer to any organic group compound comprising hydrogen and carbon; and wherein some existing Si—R bonds are broken and replaced by Si—H bonds so that subsequent bonding interaction at the surface of the dielectric layer with a diffusion barrier layer is enhanced; and
   forming a diffusion barrier layer over at least a portion of said surface of said dielectric layer.

2. The method of claim 1, wherein a portion of said diffusion barrier layer is formed within said trench structure or said via structure and a portion of said diffusion barrier layer is formed outside said trench structure or said via structure.

3. The method of claim 2, further comprising the steps of:
   forming at least one conductive layer over said diffusion barrier layer; and
   polishing at least a portion of said at least one conductive layer.

4. The method of claim 3, wherein said at least one conductive layer comprises copper.

5. The method of claim 3, wherein a portion of said at least one conductive layer is formed within said trench structure or said via structure and a portion of said at least one conductive layer is formed outside said trench structure or said via structure.

6. The method of claim 5, wherein the step of forming said at least one conductive layer comprises the steps of:
   forming a copper seed layer over said diffusion barrier layer, wherein a portion of said copper seed layer is formed within said trench structure or said via structure and a portion of said copper seed layer is formed outside said trench structure or said via structure; and
   forming a copper plate layer over said seed layer, wherein a portion of said copper plate layer is formed within said trench structure or said via structure and a portion of said copper plate layer is formed outside said trench structure or said via structure; and
   forming a copper plate layer over said seed layer, wherein a portion of said copper plate layer is formed within said trench structure or said via structure and a portion of said copper plate layer is formed outside said trench structure or said via structure.

7. The method of claim 6, further comprising the step of forming a etch stop layer over said copper plate layer.

8. The method of claim 1, wherein said adhesion solution further comprises over 50% hydrogen and at least on element selected from the group consisting of argon, helium, neon, and nitrogen.

9. The method of claim 1, wherein said diffusion barrier layer comprises a metal diffusion barrier layer.

10. The method of claim 1, wherein said diffusion barrier layer comprises a metal diffusion barrier layer including one or more of Ta, TaN, $Ta_2N$, Ti, TiN and $W_2N$.

11. The method of claim 1 wherein said diffusion barrier layer comprises a dielectric barrier diffusion layer that does not readily pass metals through it including one or more of $SiO_2$, $SiN_x$, $SiCN_x$, and $SiOC_x$.

12. The method of claim 1 wherein said adhesion solution comprises 100% hydrogen.

13. A method of manufacturing a semiconductor device comprising the steps of:
   providing a semiconductor substrate;
   forming a dielectric layer over at least a portion of said semiconductor substrate;
   etching at least one trench structure or at least one via structure in said dielectric layer to expose a portion of a surface of said semiconductor substrate;
   treating at least a portion of a surface of said dielectric layer with an adhesion solution, wherein said adhesion solution comprises over 50% hydrogen and said adhesion solution chemically interacts with said surface of said dielectric layer and adhesion solution partially or entirely replaces at least one organic group of said surface of said dielectric layer wherein said dielectric layer comprises $SiO_{(x)}R_{(y)}$ in which (x) is greater than one, (y) is greater than zero, and the letter symbol R refers to any organic group compound comprising hydrogen and carbon and wherein some existing Si—R bonds in $SiO_{(x)}R_{(x)}$ material are broken and replaced by Si—H bonds so that subsequent bonding interaction at the surface of the dielectric layer with a diffusion barrier layer is enhanced; and
   forming a diffusion barrier layer over at least a portion of said surface of said dielectric layer immediately after the surface of said dielectric layer is treated with said adhesion solution to reduce an undesired reaction of water vapor which may occur when the treated surface is exposed to air.

14. A method of manufacturing a semiconductor device comprising the steps of:
   providing a semiconductor substrate;
   forming a dielectric layer of organo-silicon glass containing Si—CH3 over at least a portion of said semiconductor substrate;
   etching at least one trench structure or at least one via structure in said dielectric layer to expose a portion of a surface of said semiconductor substrate;
   treating at least a portion of a surface of said dielectric layer of organo-silicon glass containing Si—CH3 with an adhesion solution, wherein said adhesion solution comprises over 50% hydrogen plasma and said adhesion solution chemically interacts with said surface of said dielectric layer whereby said adhesion solution partially or entirely replaces at least one organic group of said surface of said dielectric layer with hydrogen wherein said dielectric layer comprises $SiO_{(x)}R_{(y)}$ in which (x) is greater than one, (y) is greater than zero, and the letter symbol R=CH3 ; and wherein some existing Si—CH3 bonds are broken and replaced by Si—H bonds so that subsequent bonding interaction at the surface of the dielectric layer with a diffusion barrier layer is enhanced; and
   forming a diffusion barrier layer over at least a portion of said surface of said dielectric layer.

* * * * *